(12) United States Patent
Choi et al.

(10) Patent No.: US 9,374,071 B2
(45) Date of Patent: Jun. 21, 2016

(54) SEMICONDUCTOR APPARATUS

(71) Applicant: SK hynix Inc., Icheon-si Gyeonggi-do (KR)

(72) Inventors: Hoon Choi, Icheon-si (KR); Seung Geun Baek, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 183 days.

(21) Appl. No.: 14/243,154

(22) Filed: Apr. 2, 2014

(65) Prior Publication Data

US 2015/0188526 A1    Jul. 2, 2015

(30) Foreign Application Priority Data

Dec. 30, 2013    (KR) .................. 10-2013-0167057

(51) Int. Cl.
*H03H 11/26*    (2006.01)
*H03K 5/13*     (2014.01)
*H03K 5/00*     (2006.01)

(52) U.S. Cl.
CPC ........ *H03K 5/13* (2013.01); *H03K 2005/00026* (2013.01)

(58) Field of Classification Search
USPC ........................................................ 327/261
See application file for complete search history.

(56) References Cited

U.S. PATENT DOCUMENTS

| 6,125,157 | A  | * | 9/2000 | Donnelly | .................. | G06F 1/10 |
| | | | | | | 327/141 |
| 6,987,409 | B2 | * | 1/2006 | Kim | ...................... | H03L 7/0812 |
| | | | | | | 327/149 |
| 7,176,733 | B2 | * | 2/2007 | Haerle | .................. | H03L 7/0895 |
| | | | | | | 327/147 |
| 2002/0057121 | A1 | * | 5/2002 | Lee | ........................ | H03K 5/133 |
| | | | | | | 327/261 |
| 2008/0036512 | A1 | * | 2/2008 | Yamamoto | ........... | H03H 11/265 |
| | | | | | | 327/155 |
| 2010/0109753 | A1 | * | 5/2010 | Lee | ........................ | G01K 7/015 |
| | | | | | | 327/513 |
| 2011/0115535 | A1 | * | 5/2011 | Min | ....................... | H03L 7/0893 |
| | | | | | | 327/157 |

FOREIGN PATENT DOCUMENTS

KR    1020080040557 A    5/2008

* cited by examiner

*Primary Examiner* — Lincoln Donovan
*Assistant Examiner* — Patrick Chen
(74) *Attorney, Agent, or Firm* — William Park & Associates Ltd.

(57) ABSTRACT

A delay circuit of a semiconductor apparatus includes a control signal generation block configured to output a control signal having an analog voltage level in response to an input signal, and an input/output block configured to delay the input signal by a delay amount based on the analog voltage level of the control signal, and output a resultant signal.

20 Claims, 6 Drawing Sheets

| | Levels of voltages supplied by voltage supply unit | Resistance values of variable resistors |
|---|---|---|
| (a) | vint | r1, r2 |
| (b) | vint_l | r1, r2 |
| (c) | vint_l | r1_h, r2_h |

SEMICONDUCTOR APPARATUS

CROSS-REFERENCES TO RELATED APPLICATION

The present application claims priority under 35 U.S.C. §119(a) to Korean application number 10-2013-0167057, filed on Dec. 30, 2013, in the Korean Intellectual Property Office, which is incorporated herein by reference in its entirety.

BACKGROUND

1. Technical Field

Various embodiments relate to a semiconductor apparatus, and more particularly, to a delay circuit of a semiconductor apparatus.

2. Related Art

Semiconductor apparatus often include a delay circuit for delaying a signal and transmitting a delayed signal according to various needs. In many cases, managing a delay amount for a signal may result in relatively stable operation of the semiconductor apparatus.

SUMMARY

In an embodiment, a delay circuit of a semiconductor apparatus may include a control signal generation block configured to output a control signal with an analog voltage level in response to an input signal, and an input/output block configured to delay the input signal by a delay amount based on the analog voltage level of the control signal, and output a resultant signal.

In an embodiment, a delay circuit of a semiconductor apparatus may include a control signal generation block configured to output a control signal in response to an input signal, and an input/output block including a first delay unit and a second delay unit, and configured to delay the input signal by a delay amount based on a voltage level of the control signal, and output a resultant signal, wherein a delay amount implemented by the first delay unit and a delay amount implemented by the second delay unit change inversely based on a variation in the voltage level of the control signal.

DETAILED DESCRIPTION

Various embodiments of a semiconductor apparatus will be described below with reference to the accompanying drawings.

Figure 1:
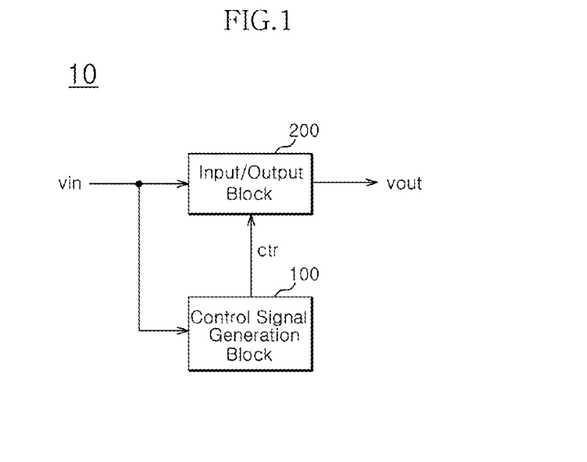
FIG. 1 is a block diagram representation of an embodiment of a delay circuit of a semiconductor apparatus.

FIG. 1 is a block diagram representation of an embodiment of a delay circuit 10 of a semiconductor apparatus.

The delay circuit 10 may include a control signal generation block 100 and an input/output block 200. The control signal generation block 100 may be configured to generate a control signal ctr having an analog voltage level in response to an input signal vin. The input/output block 200 may be configured to delay the input signal vin by a delay amount based on the analog voltage level of the control signal ctr, and output the delayed version of the input signal vin as an output signal vout.

The delay circuit 10 may be electrically coupled to a first internal circuit (not shown) and a second internal circuit (not shown) of a semiconductor apparatus. The delay circuit 10 may be configured to receive a signal transmitted from the first internal circuit to the second internal circuit, delay the received signal by a predetermined delay amount, and output a resultant signal.

The delay circuit 10 may delay an input signal by a desired delay by using a control signal having an analog voltage level, wherein the analog voltage level is determined using a circuit configuration.

Figure 2:
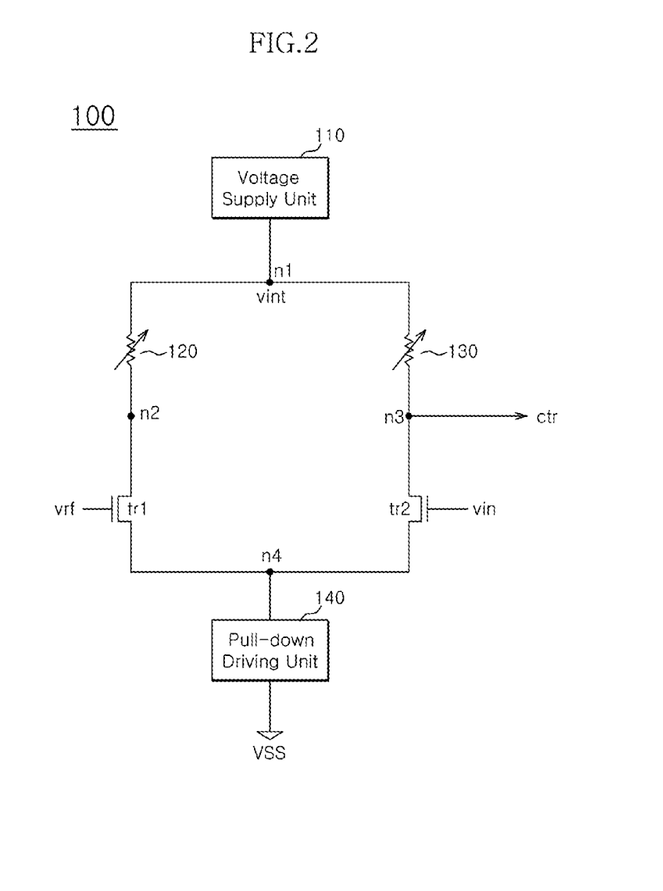
FIG. 2 is a circuit diagram of an embodiment of the control signal generation block shown in FIG. 1.

FIG. 2 is a circuit diagram of an embodiment of the control signal generation block 100 shown in FIG. 1.

The control signal generation block 100 may include a voltage supply unit 110, a first variable resistor 120, a second variable resistor 130, a first transistor tr1, a second transistor tr2, and a pull-down driving unit 140.

The voltage supply unit 110 may be electrically coupled to a first node n1. The voltage supply unit 110 may supply an internal voltage vint of a specified level to the first node n1. The first variable resistor 120 may be electrically coupled to the first node n1 and to a second node n2. The first variable resistor 120 may divide the voltage at the first node n1 and form the voltage at the second node n2. The second variable resistor 130 may be electrically coupled to the first node n1 and to a third node n3. The second variable resistor 130 may divide the voltage at the first node n1 and form the voltage at the third node n3. The first transistor tr1 may be electrically coupled to the second node n2 and to a fourth node n4. The gate of the first transistor tr1 may be configured to receive a reference voltage vrf. The second transistor tr2 may be electrically coupled to the third node n3 and to the fourth node n4. The gate of the second transistor tr2 may be configured to receive the input signal. The pull-down driving unit 140 may be electrically coupled to the fourth node n4 and to a ground terminal. The pull-down driving unit 140 may be configured to pull-down drive the fourth node n4. The voltage level of the third node n3 may be output as the control signal ctr.

The control signal generation block 100 may be configured to compare the voltage level of the input signal vin with the voltage level of the reference voltage vrf and output the control signal ctr having an analog voltage level based on the comparison. The control signal generation block 100 may be configured to output the control signal ctr having an analog voltage level determined by the resistance values of the variable resistors 120, 130. The control signal generation block 100 may output the control signal ctr having an analog voltage level based on the voltage level of the internal voltage vint supplied by the voltage supply unit 110. For example, the control signal generation block 100 may be configured to output the control signal ctr where the control signal ctr swings between a first level that is relatively lower than the level of the internal voltage vint and the level of a ground voltage vss.

When the voltage level of the input signal vin is relatively lower than the voltage level of the reference voltage vrf, the control signal generation block 100 may be configured to output the control signal ctr having a first level that is relatively lower than the level of the internal voltage vint, where the internal voltage vint is generated at the third node n3 based on the value of the second variable resistor 130. When the voltage level of the input signal vin is relatively higher than the voltage level of the reference voltage vrf, the control signal generation block 100 may be configured to output the control signal ctr having the level of the ground voltage vss, that is pulled down by the pull-down driving unit 140.

Figure 3:
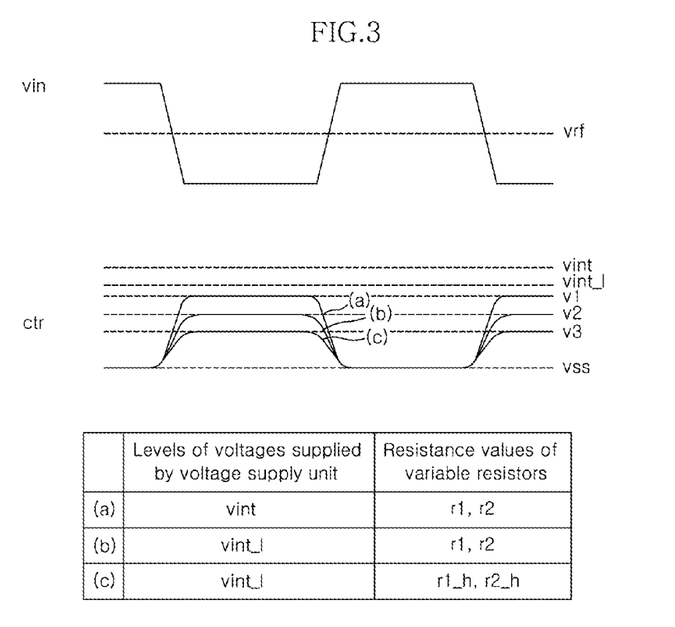
FIG. 3 is a diagram detailing the controlling the analog voltage level of the control signal outputted from the control signal generation block shown in FIG. 2.

FIG. 3 is a set of diagrams illustrating the controlling of the analog voltage level of the control signal ctr output from the control signal generation block 100 shown in FIG. 2. Embodiments of methods for controlling the analog voltage level of the control signal ctr to set a delay amount for the input signal vin will be described below with reference to FIGS. 2 and 3. The analog voltage level of the control signal ctr may be adjusted by modifying the level of the voltage supplied by the voltage supply unit 110 and adjusting the resistance values of the variable resistors 120, 130 in the control signal generation block 100 of FIG. 2.

The control signal ctr may be output according to the voltage level of the input signal vin and the level of the reference voltage vrf.

Line (a) represents the control signal ctr as the value of the control signal ctr ranges from a first level v1, where the first level v1 is relatively lower than the level of the internal voltage vint, to the level of the ground voltage vss. Line (a) represents the control signal ctr that is output when the voltage supply unit 110 supplies the internal voltage vint to the first node n1 and when the resistance values of the variable resistors 120 and 130 are set to r1 and r2, respectively.

Line (b) represents the control signal ctr as the value of the control signal ctr ranges from a second level v2, that is relatively lower than the first level v1, to the level of the ground voltage vss. Line (b) represents the control signal ctr that is output when the voltage supply unit 110 supplies a voltage vint_l, where the voltage vint_l is relatively lower than the internal voltage vint, to the first node n1 and when the resistance values of the variable resistors 120 and 130 are set to r1 and r2, respectively.

Line (c) represents the control signal ctr as the value of the control signal ctr ranges from a third level v3, where the third level v3 is relatively lower than the second level v2, to the level of the ground voltage vss. Line (c) represents the control signal ctr that is output when the voltage supply unit 110 supplies the voltage vint_l, where the voltage vint_l is relatively lower than the internal voltage vint, to the first node n1 and the resistance values of the variable resistors 120 and 130 are set to r1_h and r2_h, respectively, where r1_h and r2_h are relatively larger than r1 and r2.

The voltage level of the control signal ctr may be adjusted in this manner.

Figure 4:
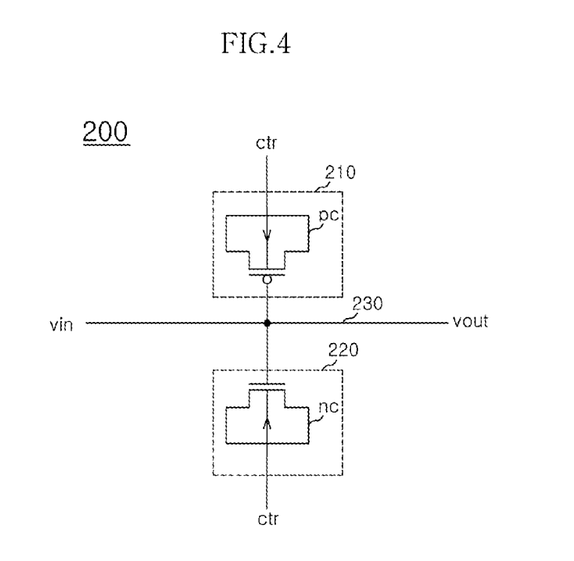
FIG. 4 is a circuit diagram representation of an example of the input/output block shown in FIG. 1.

FIG. 4 is a circuit diagram of the input/output block 200 shown in FIG. 1.

The input/output block 200 may include a first delay unit 210 and a second delay unit 220. The first delay unit 210 and the second delay unit 220 may be electrically coupled to a transmission line 230. The input signal vin is transmitted via the transmission line 230. The input/output block 200 may delay the input signal vin using the first delay unit 210 and the second delay unit 220 and generate the output signal vout.

A delay amount for the input signal vin implemented by the first delay unit 210 and a delay amount for the input signal vin implemented by the second delay unit 220 may be inversely related with respect to each other based on a variation in the voltage level of the control signal ctr. For example, when the voltage level of the control signal ctr increases, a delay amount implemented by the first delay unit 210 may increase and a delay amount implemented by the second delay unit 220 may decrease. When the voltage level of the control signal ctr decreases, a delay amount implemented by the first delay unit 210 may decrease and a delay amount implemented by the second delay unit 220 may increase. In other words, a delay amount for the input signal vin may be set by adjusting the voltage level of the control signal ctr.

The first delay unit 210 may include a PMOS type capacitor pc. The PMOS type capacitor pc may be configured to receive the control signal ctr as a body bias voltage. The drain and the source of the PMOS type capacitor pc may be electrically coupled to a line, where the control signal ctr is transmitted via that line. The gate of the PMOS type capacitor pc may be electrically coupled to the transmission line 230 of the input signal vin.

The second delay unit 220 may include an NMOS type capacitor nc. The NMOS type capacitor nc may be configured to receive the control signal ctr as a body bias voltage. The drain and the source of the NMOS type capacitor nc may be electrically coupled to a line, where the control signal ctr is transmitted via that line. The gate of the NMOS type capacitor nc may be electrically coupled to the transmission line 230 of the input signal vin.

The PMOS type capacitor pc and the NMOS type capacitor nc may delay the input signal vin and output a resultant signal via a charging and discharging process. The PMOS type capacitor pc and the NMOS type capacitor nc may have capacitances that are inversely changed according to a variation in the level of a body bias voltage, that is, the voltage level of the control signal ctr. This will be described below with reference to FIG. 5.

Figure 5:
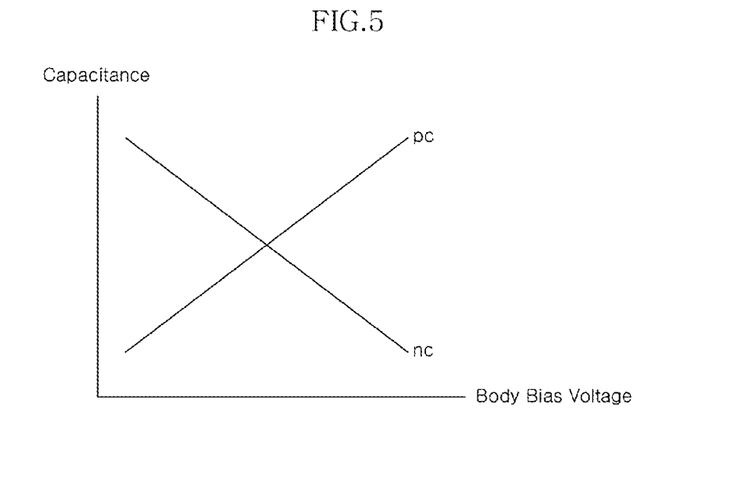
FIG. 5 is a graph showing the relationship between a body bias voltage and the capacitances of MOS type capacitors.

Referring to FIG. 5 a graph illustrating the relationship between a body bias voltage and the capacitances of PMOS type capacitor and the NMOS type capacitor is shown. The horizontal axis represents a body bias voltage and the vertical axis represents the capacitances of PMOS type capacitor and the NMOS type capacitor.

When the level of a body bias voltage increases, the capacitance of the PMOS type capacitor pc may increase and the capacitance of the NMOS type capacitor nc may decrease. When the level of a body bias voltage decreases, the capacitance of the PMOS type capacitor pc may decrease and the capacitance of the NMOS type capacitor nc may increase.

Referring back to FIG. 4, when the first delay unit 210 and the second delay unit 220 each include the PMOS type capacitor pc and the NMOS type capacitor nc, respectively, a delay amount for the input signal vin may be set based on the capacitances of the capacitors PMOS capacitor pc and the NMOS capacitor nc, where such capacitances serve as loads. As shown in FIG. 5, the capacitances of the PMOS capacitor pc and the NMOS capacitor nc may be changed according to the level of a body bias voltage, that is, the voltage level of the control signal ctr. A delay amount for the input signal vin may be set by adjusting the voltage level of the control signal ctr. In an embodiment, since the voltage level of the control signal ctr may be adjusted, a delay amount for the input signal vin may be set.

Figure 6:
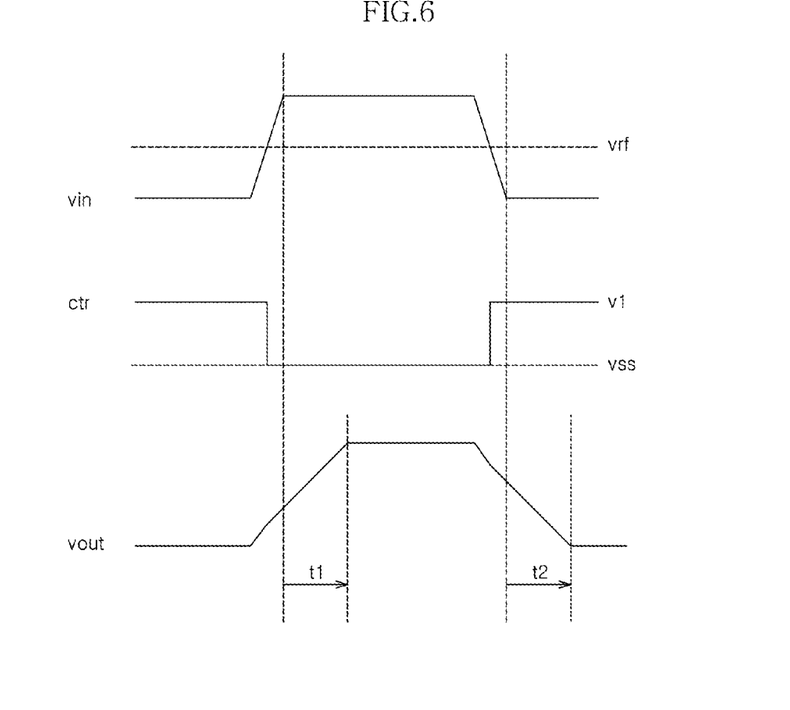
FIG. 6 is a timing diagram detailing an example of an operating method of the delay circuit shown in FIG. 1.

FIG. 6 is a timing diagram explaining an embodiment of a operating method of the delay circuit 10 shown in FIG. 1. The operating method of the delay circuit 10 will be described with reference to FIGS. 4 and 6.

When the input signal vin transitions from a low logic level to a high logic level, the input signal vin may be delayed by the PMOS type capacitor pc and the NMOS type capacitor nc, where the PMOS type capacitor and the NMOS type capacitor serve as loads. The input signal vin may be delayed by the NMOS type capacitor nc which may have a relatively high capacitance in correspondence to the control signal ctr having the voltage level of the ground voltage vss. For example, the NMOS type capacitor nc may be charged by the transmission line 230 and may delay the input signal vin by a set delay amount. The output signal vout may be output after being delayed by a time period t1.

When the input signal vin transitions from the high logic level to the low logic level, the input signal vin may be delayed by the PMOS type capacitor pc and the NMOS type capacitor nc, where the the PMOS type capacitor pc and the NMOS type capacitor serve as loads. The input signal vin may be delayed by the PMOS type capacitor pc which may have a relatively high capacitance in correspondence to the control signal ctr of the first level v1. For example, the PMOS type capacitor pc may be discharged to the transmission line 230 and may delay the input signal vin by a set delay amount. The output signal vout may be output after being delayed by a time period t2.

Figure 7:
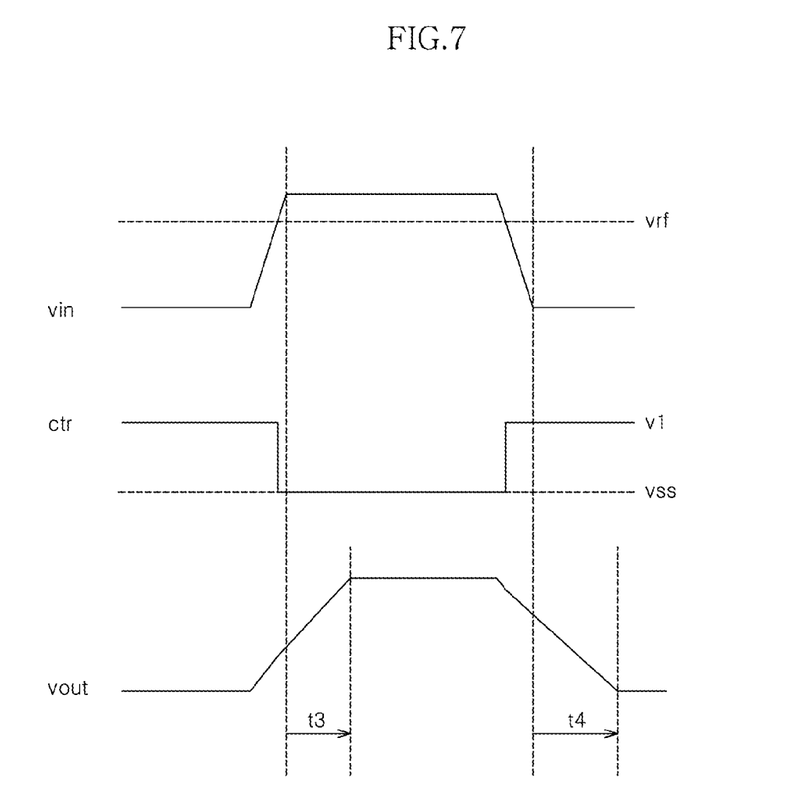
FIG. 7 is a timing diagram detailing an example of a method of controlling the reference voltage applied to the control signal generation block shown in FIG. 2.

FIG. 7 is a timing diagram explaining a method of adjusting the reference voltage vrf applied to the control signal generation block 100 shown in FIG. 2.

The control signal generation block 100 may have a response speed associated with the rising edge of the input signal vin and a response speed associated with the falling edge of the input signal vin where the response speeds are based on the level of the reference voltage vrf. A relatively high response speed of the control signal generation block 100 may mean a relatively quick transition of the control signal ctr with respect to the transition of the input signal vin. A relatively low response speed of the control signal generation block 100 may mean a relatively slow transition of the control signal ctr with respect to the transition of the input signal vin.

Referring to FIG. 7, the level of the reference voltage vrf may be adjusted to be relatively higher than a level at the middle of the swing width of the input signal vin. In this case, a response speed associated with the rising edge of the input signal vin may be relatively slower than a response speed associated with the falling edge of the input signal vin. As shown in the drawing, a delay amount of a time period t3 with respect to the rising edge of the input signal vin may be relatively shorter than a delay amount of a time period t4 with respect to the falling edge of the input signal vin.

When the reference voltage vrf received at the control signal generation block 100 is adjusted in this manner, the analog voltage level of the control signal ctr is not adjusted, but the transition time of the control signal ctr may be adjusted. As the transition time of the control signal ctr is adjusted, delay amounts with respect to the rising edge and the falling edge of the input signal vin may be adjusted accordingly. The control signal generation block 100 may output the control signal ctr of an analog voltage level which is relatively more finely controlled.

Figure 8:
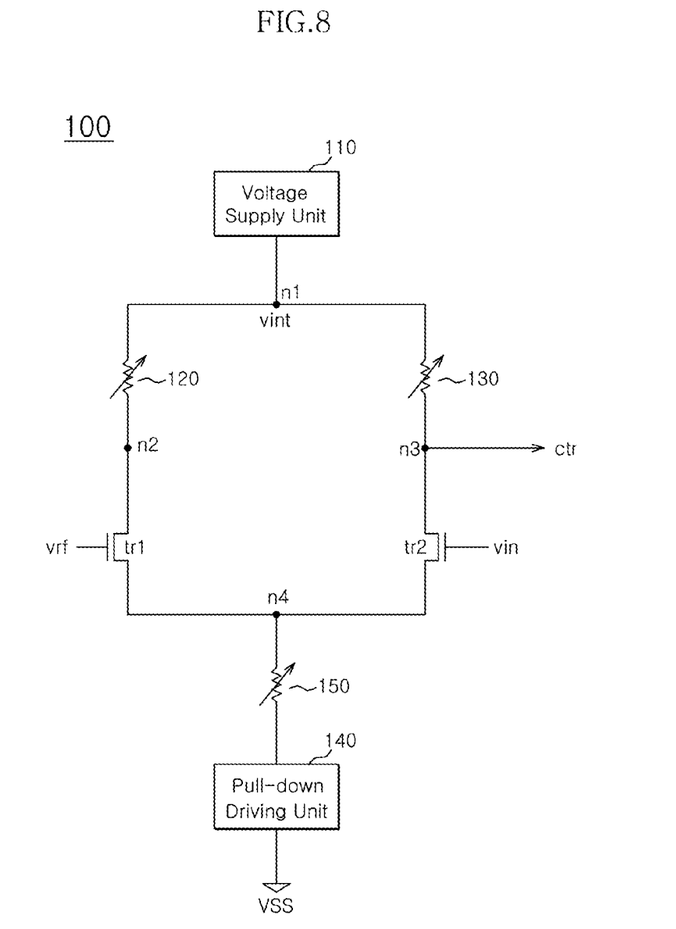
FIG. 8 is a circuit diagram of an embodiment of the control signal generation block shown in FIG. 1.

FIG. 8 is a circuit diagram of an embodiment of the control signal generation block 100 shown in FIG. 1. The same reference numerals used in FIG. 2 will be used in FIG. 8 to refer to the same or like component elements of the control signal generation block 100 of FIG. 2.

In the control signal generation block 100 of FIG. 8, a third variable resistor 150 may be electrically coupled to the fourth node n4 and to the pull-down driving unit 140. When the voltage level of the input signal vin is relatively lower than the voltage level of the reference voltage vrf, the control signal generation block 100 may output the control signal ctr having a level that is relatively lower than the level of the internal voltage vint that is generated at the third node n3 by the second variable resistor 130. When the voltage level of the input signal vin is relatively higher than the level of the reference voltage vrf, the control signal generation block 100 may output the control signal ctr having a level that is relatively higher than the level of the ground voltage vss which is generated at the fourth node n4 by the third variable resistor 150. The control signal generation block 100 may output the control signal ctr having an analog voltage level that is relatively more finely controlled.

In an embodiment, the control signal generation block 100 may include only the third variable resistor 150 without including the first variable resistor 120 and the second variable resistor 130.

Figure 9:
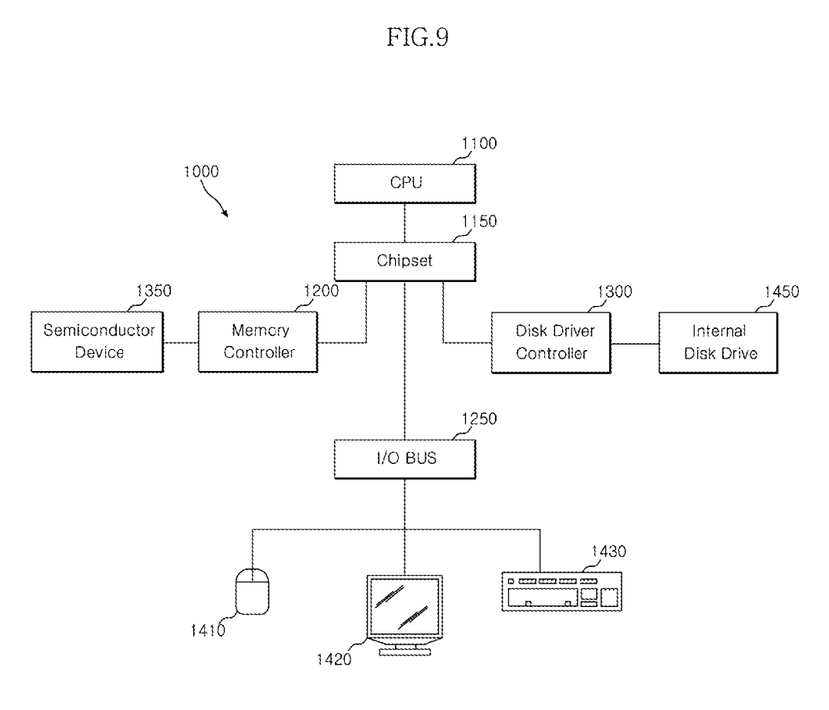
FIG. 9 is a system diagram including a semiconductor apparatus including an embodiment of the delay circuit.

Referring to FIG. 9, a block diagram representation of a system 1000 including an embodiment of a semiconductor device 1350 is shown. In an embodiment, the semiconductor device 1350 is the semiconductor device including the delay circuit of FIG. 1. The system 1000 includes one or more semiconductor devices 1350 and a memory controller 1200

In an embodiment, the semiconductor device 1350 is a semiconductor memory device. In an embodiment, a system includes a memory controller and a semiconductor memory device including a delay circuit. The delay circuit of the semiconductor memory device may include a control signal generation block configured to output a control signal having an analog voltage level in response to an input signal, and an input/output block configured to delay the input signal by a delay amount based on the analog voltage level of the control signal, and output a resultant signal.

Examples of the semiconductor device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more semiconductor devices 1350. The semiconductor devices 1350 may be any one of a number of industry standard memory types, including but not limited to, single inline memory modules ("SIMMs") and dual inline memory modules ("DIMMs"). Further, the semiconductor devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1300 may also be electrically coupled to the chipset 1150. The disk drive controller 1300 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 9 is merely one example of a system employing a semiconductor device 1350. In alternate embodiments, such as cellular phones or digital cameras, the components may differ from the embodiment shown in FIG. 9.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A delay circuit of a semiconductor apparatus, comprising:
a control signal generation block configured to output a control signal having an analog voltage level in response to an input signal; and
an input/output block configured to delay the input signal by a delay amount based on the analog voltage level of the control signal, and output a resultant signal,
wherein the control signal generation block comprises:
a voltage supply unit configured to supply an internal voltage to a first node;
a pull-down driving unit configured to pull-down drive a second node;
a first variable resistor and a first transistor electrically coupled between the first and the second nodes in series, a gate of the first transistor receiving a reference voltage; and
a second variable resistor and a second transistor electrically coupled between the first and the second nodes in series, a gate of the second transistor receiving the input signal; and
wherein the control signal is output from a third node between the second variable resistor and the second transistor.

2. The delay circuit according to claim 1, wherein the control signal generation block compares a voltage level of the input signal with a level of the reference voltage, and outputs the control signal based on the comparison.

3. The delay circuit according to claim 2, wherein the control signal generation block has a first response speed based on a rising edge of the input signal and a second response speed based on a falling edge of the input signal that are determined based on the level of the reference voltage.

4. The delay circuit according to claim 1,
wherein the control signal generation block outputs the control signal with the analog voltage level based on resistance values of the first and the second variable resistors.

5. The delay circuit according to claim 1,
wherein the control signal generation block outputs the control signal with the analog voltage level based on a level of the internal voltage supplied by the voltage supply unit.

6. The delay circuit according to claim 1,
wherein the input/output block comprises a first delay unit and a second delay unit, and
wherein a delay amount for the input signal implemented by the first delay unit and a delay amount for the input signal implemented by the second delay unit change inversely based on a variation in the analog voltage level of the control signal.

7. The delay circuit according to claim 6,
wherein the first delay unit and the second delay unit delay the input signal and output the resultant signal via a charging and discharging process, and
wherein the first delay unit and the second delay unit have capacitances that change inversely based on a variation in the analog voltage level of the control signal.

8. The delay circuit according to claim 7, wherein the capacitance of the first delay unit increases when the analog voltage level of the control signal increases.

9. The delay circuit according to claim 7, wherein the first delay unit comprises a PMOS type capacitor configured to receive the control signal as a body bias voltage.

10. The delay circuit according to claim 7, wherein the capacitance of the second delay unit increases when the analog voltage level of the control signal decreases.

11. The delay circuit according to claim 7, wherein the second delay unit comprises an NMOS type capacitor configured to receive the control signal as a body bias voltage.

12. A delay circuit of a semiconductor apparatus, comprising:
a control signal generation block configured to output a control signal in response to an input signal; and
an input/output block including a first delay unit and a second delay unit, and configured to delay the input signal by a delay amount based on a voltage level of the control signal, and output a resultant signal,
wherein a delay amount implemented by the first delay unit and a delay amount implemented by the second delay unit change inversely based on a variation in the voltage level of the control signal,
wherein the control signal generation block comprises:
a voltage supply unit configured to supply an internal voltage to a first node;
a pull-down driving unit configured to pull-down drive a second node;

a first variable resistor and a first transistor electrically coupled between the first and the second nodes in series, a gate of the first transistor receiving a reference voltage; and a second variable resistor and a second transistor electrically coupled between the first and the second nodes in series, a gate of the second transistor receiving the input signal; and wherein the control signal is output from a third node between the second variable resistor and the second transistor.

13. The delay circuit according to claim 12, wherein the control signal generation block outputs the control signal with an analog voltage level.

14. The delay circuit according to claim 12, wherein the control signal generation block compares a voltage level of the input signal with a level of the reference voltage, and outputs the control signal based on the comparison.

15. The delay circuit according to claim 14, wherein the control signal generation block has a first response speed based on a rising edge of the input signal and a second response speed based on a falling edge of the input signal that is determined based on the level of the reference voltage.

16. The delay circuit according to claim 12, wherein the analog voltage level is based on resistance values of the first and the second variable resistors.

17. The delay circuit according to claim 12, wherein the control signal generation block outputs the control signal with the analog voltage level based on a level of the internal voltage supplied by the voltage supply unit.

18. The delay circuit according to claim 12, wherein the first delay unit and the second delay unit delay the input signal and output the resultant signal through via a charging and discharging process, and wherein the first delay unit and the second delay unit have capacitances that change inversely based on a variation in the voltage level of the control signal.

19. The delay circuit according to claim 12, wherein the first delay unit comprises a PMOS type capacitor configured to receive the control signal as a body bias voltage.

20. The delay circuit according to claim 12, wherein the second delay unit comprises an NMOS type capacitor configured to receive the control signal as a body bias voltage.

\* \* \* \* \*